United States Patent [19]

Krawitz

[11] Patent Number: 4,625,319
[45] Date of Patent: Nov. 25, 1986

[54] NARROW BAND, SSB, FM TRANSMITTER

[76] Inventor: Marc S. Krawitz, 3001 Chapel Hill Rd., Orange, Calif. 92667

[21] Appl. No.: 648,784

[22] Filed: Sep. 10, 1984

[51] Int. Cl.$^4$ .................................................. H03C 1/52
[52] U.S. Cl. ........................................ 375/61; 375/62; 332/17
[58] Field of Search ................. 375/42, 43, 61, 62; 455/61, 102, 109; 370/11; 332/17, 22, 23 R, 31 T, 41, 44, 45; 331/107 T; 307/458

[56] References Cited

U.S. PATENT DOCUMENTS

| | | | |
|---|---|---|---|
| 2,923,887 | 2/1960 | Aiken | 332/41 |
| 3,069,679 | 12/1962 | Sweeney et al. | 332/17 |
| 3,275,951 | 9/1966 | Maass | 332/44 |
| 3,517,313 | 6/1970 | Vasile | 455/61 |
| 3,679,992 | 7/1972 | Yerman | 331/107 T |
| 3,868,599 | 2/1975 | Hirasaki et al. | 332/45 |
| 3,974,460 | 8/1976 | Hongu et al. | 332/31 T |
| 4,170,764 | 10/1979 | Salz et al. | 332/22 |
| 4,321,490 | 3/1982 | Bechdolt | 307/458 |
| 4,481,642 | 11/1984 | Hanson | 375/62 |

Primary Examiner—Robert L. Griffin
Assistant Examiner—Stephen Chin
Attorney, Agent, or Firm—Willie Krawitz

[57] ABSTRACT

A circuit for producing SSB, FM signals comprises an FM modulator connected to a balanced modulator, both modulators being fed by an audio digital pulse source. When the audio source is off, the balanced modulator will also be off, and the FM signal will not be passed. When the audio signal is turned on, it will be trasmitted by the FM modulator and also turn on the balanced modulator. The FM carrier will be suppressed by the balanced modulator, and the number of FM sidebands will increase, thereby increasing the output bandwidth. Also, the output power/sideband will be decreased. Hence, subsequent filtering to obtain a selected single FM sideband is made easier. The output signal is then passed through a limiter to remove the AM components, and the SSB component is amplified for transmission.

17 Claims, 2 Drawing Figures

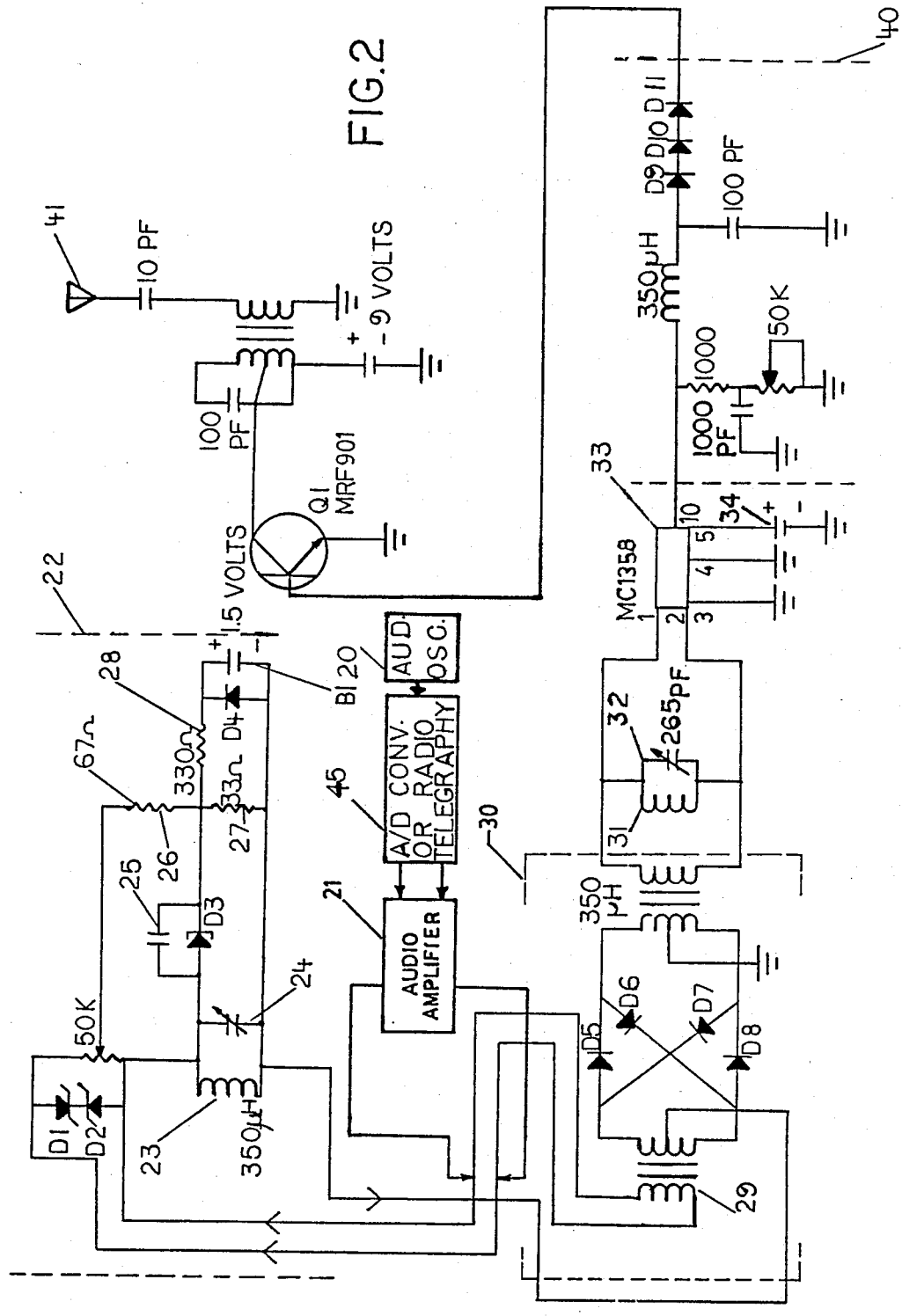

NARROW BAND, SSB, FM TRANSMITTER

BACKGROUND OF THE INVENTION

This invention relates to a transmission system for producing single sideband FM digital signals.

The advantages of such a system compared to a multi sideband FM signal are readily apparent. For example, a narrower bandwidth and greater range is obtainable at the same power, and the S/N ratio will, of course, be improved.

THE INVENTION

According to the invention, a system is provided for broadcasting an SSB, FM digital signal which comprises a pulse forming circuit; a first amplifier for the pulse signals; a circuit for producing FM signals and connected to the first amplifier; a second amplifier for the digital pulses; a balanced modulator for receiving the FM signals, and the signals from the second amplifier; a limiter to remove the AM components generated by the balanced modulator; a filter connected to the limiter to pass the SSB, FM signal; and, an RF amplifier for the output signal.

The balanced modulator functions as an on-off circuit for the FM signal portion. Actuation of the balanced modulator is by on-off digital signals from the pulse forming circuit through the second amplifier. Since the modulator is receiving a signal of constant amplitude from the FM circuit, the FM signal will be treated as a carrier. Hence, the net output from the balanced modulator will be the FM sidebands, each with an AM envelope, but with the carrier suppressed.

The number of FM sidebands will be doubled by the action of the balanced modulator, and hence, their signal strength will be decreased, but the bandwidth will be increased. This facilitates subsequent filtering to obtain the desired SSB, FM component. The AM envelopes are removed by a limiter, and the SSB signal is amplified for transmission.

DESCRIPTION OF THE PREFERRED EMBODIMENTS

Figure 1:
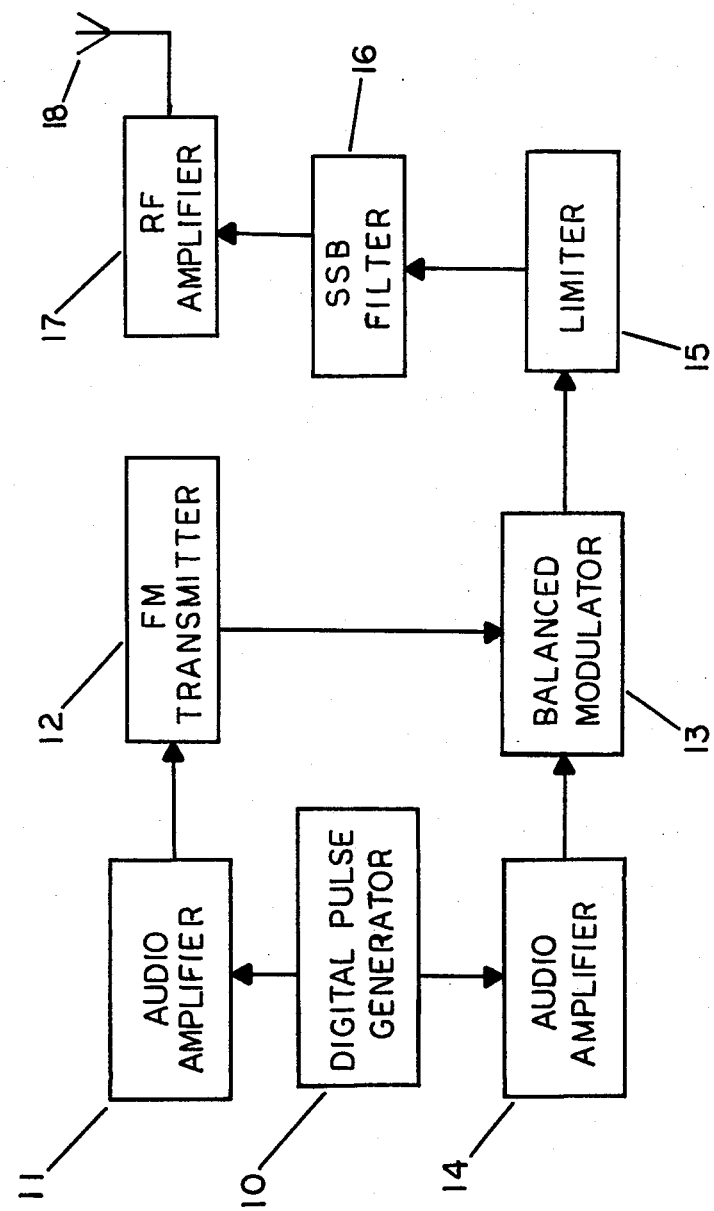
FIG. 1 is a system diagram of the invention; and,
FIG. 2 is a circuit diagram of the invention.

A system flow diagram of the invention is shown in FIG. 1, and includes a digital pulse generator 10 having an audio frequency range. The pulse generator can also be an analogue signal source 45 which is converted into digital pulses, radiotelegraphy, etc. Signals from the pulse generator 10 are split, one portion being amplified in a first audio amplifier 11, the output of which modulates an FM transmitter 12. The FM output is then fed to a balanced modulator 13. The other portion of signals from the pulse generator 10 are amplified in a second audio amplifier 14, and these amplified pulse signals are also fed to the balanced modulator 13. In the absence of an audio signal, the FM signal will not be admitted, and there will be no output from the balanced modulator. However, when the pulse generator 10 is turned on, the balanced modulator will also be turned on and admit the FM signal from the transmitter 12. The balanced modulator will eliminate the FM carrier and also increase the number of FM sidebands, each of these sidebands having an AM envelope.

Hence, the balanced modulator will increase the bandwidth, and decrease the signal strength of each sideband. Consequently, when the output is subsequently filtered, isolation of the desired FM single sideband will be facilitated. The signal from the balanced modulator is then passed through a limiter 15 to remove the AM components, and filtered 16, such as by a bandpass filter, to produce the FM, SSB component. If desired, the filter and limiter can be interchanged. Finally, the signal is amplified 17 and fed to the antenna 18.

A circuit for producing a digital SSB, FM signal, according to the invention, is shown in FIG. 2. Signals from a battery driven, audio oscillator 20 (Radio Shack 1981 catalogue 28–49, page 85) having a switch, not shown, feeds a battery driven audio push pull amplifier (Radio Shack 1981 catalogue 28–49, page 38). One set of signals is sent from the amplifier to the FM transmitter 22 shown in dotted designation. The transmitter includes Zener diodes $D_1$, $D_2$ and a 50K potentiometer for preventing excessive voltage fluctuations.

Signals from the Zener pair are fed to an inductor 23, and variable capacitor 24 tank circuit and then to a tunnel diode oscillator $D_3$ and capacitor 25. The transmitter is driven by a low powered battery $B_1$ which uses a diode $D_4$ to prevent reverse polarity. Resistors 26, 27 and 28 are used to protect the tunnel diode and set the proper voltage levels. The FM output is sent to the center tap of an input transformer 29 of a balanced (ring) modulator 30. Signals from the audio amplifier 21 are also sent to the input transformer 29. Diodes $D_5$, $D_6$, $D_7$, $D_8$ are Schottky barrier diodes that are switched almost instantaneously from an open circuit to a short circuit as the carrier changes polarity.

The signal output can be considered as being controlled by a switching function F(t) that varies between 0 and 1. Using a Fourier representation of this function, it can be shown that the output will contain the original signal, upper and lower sidebands and other harmonics, but no carrier.

The balanced modulator will only conduct when it receives a signal from the audio oscillator. When a signal from the oscillator is received, the balanced modulator will conduct and simultaneously admit the FM signal. The FM output sidebands in their respective envelopes, will be transmitted, but the carriers will be suppressed. The output from the balanced modulator is then filtered by an inductor 31 and capacitor 32 tank circuit. A better filter arrangement would, of course, employ a band pass filter. Since the balanced modulator will double the number of FM sidebands, the output power/sideband will be decreased, but the bandwidth will be increased; also, the carrier as indicated is removed. Hence, filtering to obtain the desired SSB component is facilitated. The signal is then passed through a limiter and amplifier I.C. chip 33 which removes the AM and amplifies the signal. The chip is driven by a battery 34. At this point, the FM frequency is about 1 MHz. The signal from the chip is then sent to a frequency multiplier 40 using diodes $D_9$, $D_{10}$, and $D_{11}$ to obtain the desired output frequency. Finally, the signal is sent to an R.F. output amplifier $Q_1$ which is transformer coupled to an antenna 41.

EXAMPLE

Using the circuit as described, signals were broadcast at an output frequency of about 81 MHz, i.e., Channel 5. The receiver was a Sony Trinitron color television, Model KV-1710. With the FM portion of the circuit 'on', but with no signal from the audio oscillator 20, no output was transmitted. When the oscillator 20 was repeatedly turned on and off, corresponding low audible signals were received on the FM sound portion of the receiver, and a small amount of AM speckling occurred corresponding to the on-off signals. Use of an additional limiter would, of course, remove this AM speckling. It was observed that when the multiplier was placed before the limiter, a considerable amount of AM picture interference occurred. In other words, both AM and FM signals were generated, but the AM could be effectively removed.

In addition to the obvious uses in FM radio and radiotelegraphy, the present invention may be used in television communication, in radar, and as a communication link between computers, etc.

The diode components employed in the circuit shown in FIG. 2, are as follows: Schottky diodes D5–D8: 5082-2835; Zener diodes D1, D2: 1N4733; tunnel diode D3: 1N3714; Diodes D4 and D9–D11: 1N914.

I claim:

1. A transmission system for single sideband, frequency modulated signals, comprising:
   a. a frequency modulating signal means;
   b. a balanced modulator connected to the output of the frequency modulating signal means;
   c. an audio frequency digital signal source having a single discrete frequency for simultaneously actuating the balanced modulator and the frequency modulating signal means, the audio signal source being connected to the said modulator and to the frequency modulating signal means, the balanced modulator being adapted to turn on and conduct a signal from the frequency modulating signal means when the audio frequency digital signal source is turned on, and to turn off when the said audio source is turned off, thereby preventing transmission from the balanced modulator, the output from the balanced modulator being in the form of a frequency modulated signal with corresponding amplitude envelopes;
   d. means for amplifying an audio signal from the said audio frequency digital signal source to the frequency modulating signal means and to the balanced modulator;
   e. a limiter connected to the output of the balanced modulator for removing the amplitude modulated envelopes produced by the balanced modulator, and for passing the frequency modulated signal;
   f. a bandpass filter connected to the limiter for selecting a single sideband portion of the frequency modulated signal for transmission; and,
   g. amplifying and antenna means for broadcasting the single sideband frequency modulated signal.

2. The transmission system of claim 1, including multiplier means connected to the filter and amplifying and antenna means to produce a selected frequency for the single sideband frequency modulated output.

3. The system of claim 1, in which the balanced modulator is a ring modulator.

4. The system of claim 1, including a tunnel diode oscillator for producing an FM signal.

5. The system of claim 1, including an I.C. chip for limiting and amplifying the signal from the balanced modulator.

6. The system of claim 1, in which the audio frequency digital source signal includes an analogue signal means and an analogue to digital converter, and radiotelegraphy.

7. The system of claim 1, in which the balanced modulator includes Schottky diodes.

8. The system of claim 1, including a tunnel diode oscillator for producing the FM signals, and a ring modulator including Schottky diodes.

9. The system of claim 8, including an I.C. chip for limiting and amplifying the signal from the balanced modulator.

10. A circuit for producing a frequency modulated signal, comprising:
    a. a frequency modulating circuit, including a tunnel diode oscillator for producing a frequency modulated carrier;
    b. a ring modulator connected to the output of the frequency modulating circuit, and including Schottky diodes for instantaneous switching when the carrier changes polarity;
    c. an audio frequency digital signal source having a single, discrete frequency for simultaneously actuating the ring modulator and the frequency modulating circuit, the audio frequency digital signal source being directly connected to the ring modulator and to the frequency modulating circuit, the ring modulator being adapted to turn on and conduct a signal from the frequency modulating circuit when the audio frequency digital signal source is turned on, and to turn off when the audio signal source is turned off, thereby preventing transmission from the ring modulating circuit, the output from the ring modulator being a frequency modulated signal with corresponding amplitude envelopes;
    d. means for amplifying a digital signal from the audio frequency digital signal source to the frequency modulating circuit, and to the ring modulator;
    e. a limiter and amplifier connected to the ring modulator for removing amplitude modulated envelopes produced by the ring modulator, and for passing the frequency modulated signal;
    f. a band pass filter connected to the limiter for passing a single sideband output; and,
    g. amplifying and antenna means to amplify and broadcast the single sideband frequency modulated signal.

11. The circuit of claim 10, including an I.C. chip for limiting and amplifying the output signal from the modulator.

12. The circuit of claim 10, in which the audio signal source and the FM output are transformer coupled to the modulator.

13. The circuit of claim 10, in which the audio frequency digital source signal includes an analogue signal means and an analogue to digital converter, and radiotelegraphy.

14. A method for producing a single sideband frequency modulated signal, comprising:
    a. producing a frequency modulated signal and turning the signal on and off with amplified signals from an audio frequency digital signal source having a single discrete frequency;
    b. feeding the frequency modulated signal to a balanced modulator;
    c. turning the balanced modulator on and off with amplified signals from the audio source, the balanced modulator and the frequency modulated signal being turned on and off simultaneously;

d. forming a frequency modulated signal with corresponding amplitude envelopes in the balanced modulator;

e. removing the amplitude envelopes produced by the balanced modulator with a limiter, and amplifying and passing a frequency modulated signal;

f. filtering the frequency modulated signal from the limiter with a bandpass filter to produce a single sideband output; and, g. amplifying and transmitting the single sideband frequency modulated signal.

15. The method of claim 14, in which the balanced modulator is a ring modulator.

16. The method of claim 14, in which the modulator includes Schottky diodes for on-off switching when the carrier changes polarity.

17. The method of claim 14, in which the audio frequency digital source signal includes an analogue signal means and an analogue to digital converter, and radiotelegraphy.

* * * * *